(12) United States Patent
Otsuka (10) Patent No.: US 7,400,524 B2
(45) Date of Patent: Jul. 15, 2008

(54) SEMICONDUCTOR MEMORY DEVICE AND SEMICONDUCTOR DEVICE

(75) Inventor: Nobuaki Otsuka, Komae (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 50 days.

(21) Appl. No.: 11/552,662

(22) Filed: Oct. 25, 2006

(65) Prior Publication Data

US 2007/0097729 A1    May 3, 2007

(30) Foreign Application Priority Data

Oct. 28, 2005   (JP)   ............................. 2005-314714

(51) Int. Cl.
*G11C 11/40*   (2006.01)
(52) U.S. Cl. ...................................... 365/154; 365/156
(58) Field of Classification Search ................... 365/175
See application file for complete search history.

(56) References Cited

U.S. PATENT DOCUMENTS 3,573,505 A * 4/1971 Gaensslen et al. ........... 327/219
4,701,883 A * 10/1987 Wrathall et al. ............. 365/154
4,724,530 A *  2/1988 Dingwall .................... 365/156
7,123,504 B2   10/2006 Yabe

FOREIGN PATENT DOCUMENTS

JP       2002-164445       6/2002

* cited by examiner

*Primary Examiner*—Tan T. Nguyen
(74) *Attorney, Agent, or Firm*—Oblon, Spivak, McClelland, Maier & Neustadt, P.C.

(57) ABSTRACT

A flip-flop includes a first storage node at one terminal and a second storage node at the other terminal. The gate of a first MOS connects to the first storage node. The gate of a second MOS connects to the second storage node. One end of the current path of a first transfer connects to one end of the current path of the first MOS. One end of the current path of a second transfer connects to one end of the current path of the second MOS. The anode of a first diode connects to the first storage node. The cathode of the first diode connects to one end of the current path of the second transfer. The anode of a second diode connects to the second storage node. The cathode of the second diode connects to one end of the current path of the first transfer.

17 Claims, 5 Drawing Sheets

SEMICONDUCTOR MEMORY DEVICE AND SEMICONDUCTOR DEVICE

CROSS-REFERENCE TO RELATED APPLICATIONS

This application is based upon and claims the benefit of priority from prior Japanese Patent Application No. 2005-314714, field Oct. 28, 2005, the entire contents of which are incorporated herein by reference.

BACKGROUND OF THE INVENTION

1. Field of the Invention

The present invention relates to a semiconductor memory device and semiconductor device and, for example, to a volatile semiconductor memory device having an SRAM cell.

2. Description of the Related Art

The mainstream memory cell of a current static random access memory (SRAM) is a CMOS-type 6T cell having six MOS transistors. This cell is formed from a flip-flop including two CMOS inverters, and two transfer gates that connect the two nodes of the flip-flop to a bit line pair. As a characteristic feature, an SRAM can stably maintain data because it statically stores data by using a flip-flop (e.g., Jpn. Pat. Appln. KOKAI Publication No. 2002-164445).

However, as the element size decreases aiming at improving the performance of an large-scale integrated circuit (LSI) and increasing the number of mounted elements, scaling of the power supply voltage also progresses. Along with the size reduction, a threshold voltage Vth of a transistor, which should be controlled to a given value, varies between elements remarkably.

Static noise margin (SNM) is an index representing the operation margin of an SRAM. The SNM is a voltage margin during operation and is well known as a so-called butterfly curve of an SRAM cell, which superimposes the input/output characteristics of two inverters included in a flip-flop when a word line of a given cell is selected, i.e., the transistor of its transfer gate is ON. Even when the input/output characteristic shifts due to noise, there is a margin corresponding to the SNM before the butterfly curve distorts to destroy data. The larger the SNM is, the more stable the data maintain characteristic of a cell is. Unlike a normal inverter characteristic, when a word line is turned on, the potential on the low ("L") level side is raised by the level (normally high ("H") level) of a bit line connected through a transfer gate to an intermediate potential determined by the drive power ratio of the transfer gate to a driver (NMOS transistor included in the inverter).

As described above, scaling of the power supply voltage causes scaling of the entire butterfly curve so that the SNM becomes small, as a matter of course. Additionally, when the threshold voltage Vth varies, the characteristics of the two inverters included in the flip-flop shift from each other. This makes the butterfly curve asymmetric. The smaller characteristic determines the SNM of the SRAM cell. If scaling of the power supply voltage progresses, and the threshold voltage Vth varies to a certain extent or more with a distribution, no SNM is ensured. That is, cells having no butterfly curve exist stochastically. The probability rises as the capacity of the SRAM increases, i.e., the number of SRAM cells increases. The word line of such a cell is in a selected state. Changing the transfer gate to the ON state alone may destroy stored data. Hence, the memory cannot normally operate.

An SRAM can employ various kinds of array architectures. A compilable SRAM capable of flexibly changing the number of bits and structure generally employs an array architecture that forms a cluster corresponding to each I/O to ensure the degree of freedom of the I/O width from the viewpoint of the area efficiency, speed, and power. In this case, when a row is selected, a cell at the cross-point between that row and a column selected for each I/O is actually selected and accessed to write or read data. Cells connected to the same row of the selected cell and unselected columns need to maintain data without read or write, although the word lines are turned on. Assume that these cells include the above-described cell without SNM. In write, new data is written in the selected cell connected to the selected column so data destruction does not occur. However, all cells connected to unselected columns with word lines in the ON state may cause data destruction. In read, all cells connected to the selected row and having word lines in the ON state may cause data destruction independently of the selected/unselected state of the columns.

BRIEF SUMMARY OF THE INVENTION

According to a first aspect of the present invention, there is provided a semiconductor memory device comprising a flip-flop which is formed by cross-coupling inputs and outputs of two inverters, the flip-flop including a first storage node at one terminal and a second storage node at the other terminal, a first MOS transistor of first conductivity type which has a gate connected to the first storage node of the flip-flop, a second MOS transistor of first conductivity type which has a gate connected to the second storage node of the flip-flop, a first transfer gate which has a current path with one end connected to one end of a current path of the first MOS transistor, a second transfer gate which has a current path with one end connected to one end of a current path of the second MOS transistor, a first diode which has an anode connected to the first storage node of the flip-flop and a cathode connected to one end of the current path of the second transfer gate, and a second diode which has an anode connected to the second storage node of the flip-flop and a cathode connected to one end of the current path of the first transfer gate.

According to a second aspect of the present invention, there is provided a semiconductor memory device comprising a flip-flop which is formed by cross-coupling inputs and outputs of two inverters, the flip-flop including a first storage node at one terminal and a second storage node at the other terminal, a MOS transistor of first conductivity type which has a gate connected to the first storage node of the flip-flop, a first transfer gate which has a current path with one end connected to one end of a current path of the MOS transistor, a first diode which has an anode connected to the first storage node of the flip-flop, a second transfer gate which has a current path with one end connected to a cathode of the first diode, and a second diode which has an anode connected to the second storage node of the flip-flop, the second diode having a cathode connected to one end of the current path of the first transfer gate.

According to a third aspect of the present invention, there is provided a semiconductor device comprising a first semiconductor region of first conductivity type which is formed on an insulating layer, a second semiconductor region of the first conductivity type which is formed on the insulating layer to be apart from the first semiconductor region, a third semiconductor region of second conductivity type which is formed on the insulating layer between the first semiconductor region and the second semiconductor region, a gate insulating film which is formed on the third semiconductor region, a gate electrode which is formed on the gate insulating film, a fourth semiconductor region of the second conductivity type which is formed on the insulating layer to contact the second semiconductor region, a first contact member which is formed on the first semiconductor region, a second contact member which is formed on the fourth semiconductor region, and an element isolation insulating region which is formed to surround the first semiconductor region, the second semiconductor region, the third semiconductor region, and the fourth semiconductor region.

DETAILED DESCRIPTION OF THE INVENTION

Semiconductor memory devices according to the embodiments of the present invention will be described below with reference to the accompanying drawing. The same reference numerals denote the same parts throughout the drawing.

First Embodiment

Figure 1:
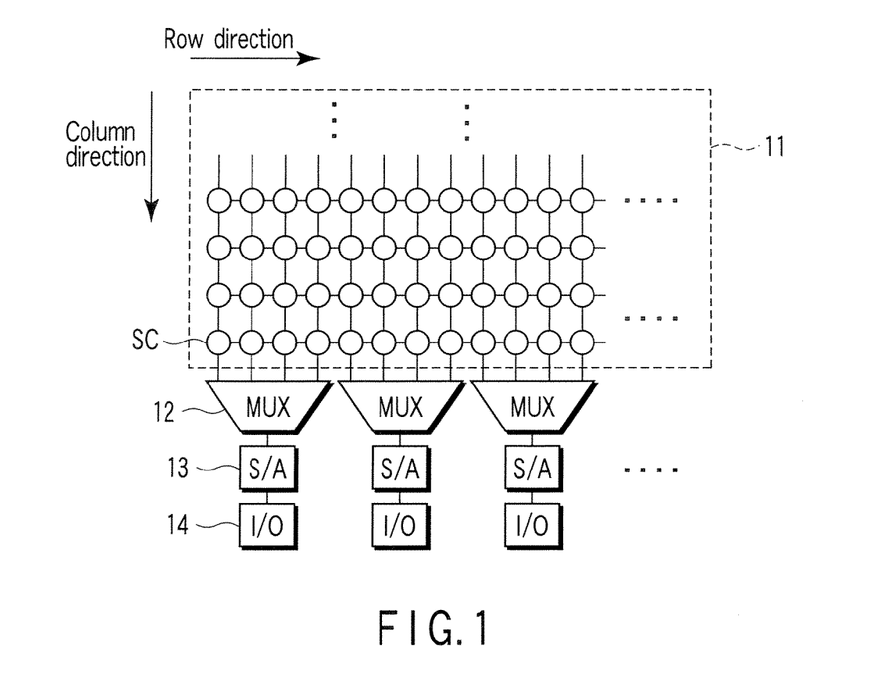
FIG. 1 is a view showing the arrangement of a semiconductor memory device having SRAM cells according to a first embodiment of the present invention.

FIG. 1 is a view showing the arrangement of a semiconductor memory device having SRAM cells according to the first embodiment of the present invention. FIG. 1 shows part of an output-side circuit.

A cell array 11 includes a plurality of SRAM cells SC arrayed in a matrix in the row and columns directions. Cells arrayed in a single row connect to one word line. Cells arrayed in a single column connect to one bit line pair. It is advantageous for the cell array 11 to employ an architecture that forms a cluster of a plurality of bit line pairs corresponding to each I/O circuit from the viewpoint of the area efficiency, speed, and power. In this embodiment as well, a multiplexer (MUX) 12 connects to a predetermined number of bit line pairs. An input/output circuit (I/O) 14 connects to the multiplexer 12 via a sense amplifier (S/A) 13. In this cell array, when a row (word line) is selected, a cell at the cross-point between that row and a column (bit line pair) selected for each I/O is actually selected and accessed to write or read data.

Figure 2:
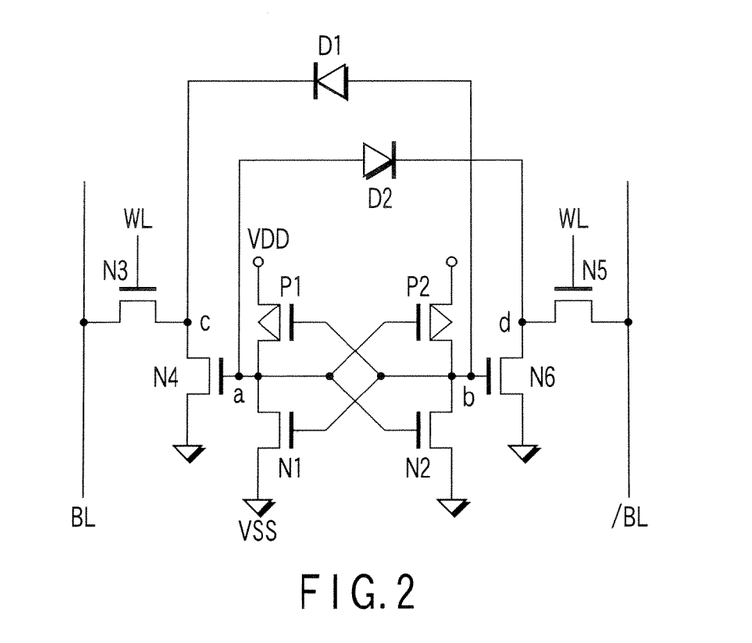
FIG. 2 is a circuit diagram showing the structure of an SRAM cell according to the first embodiment.

FIG. 2 is a circuit diagram showing the structure of the SRAM cell SC.

This SRAM cell comprises a flip-flop including two CMOS inverters, transfer gate transistors N3 and N5, two N-channel MOS transistors (to be referred to as NMOS transistors hereinafter) N4 and N6, and PN diodes D1 and D2. The flip-flop has an inverter including a P-channel MOS transistor (to be referred to as a PMOS transistor hereinafter) P1 and an NMOS transistor N1, and an inverter including a PMOS transistor P2 and an NMOS transistor N2. The PMOS transistors P1 and P2 are load transistors. The NMOS transistors N1 and N2 are driver transistors. A power supply voltage VDD is supplied to the sources of the PMOS transistors P1 and P2. A ground potential Vss is supplied to the sources of the NMOS transistors N1 and N2.

The flip-flop is the same as in a conventional SRAM cell. One terminal of each of the transfer gates N3 and N5 whose gates are controlled by a word line WL connects to a corresponding one of not nodes a and b of the flip-flop but drains c and d of the two NMOS transistors N4 and N6 with sources grounded. The nodes a and b of the flip-flop connect to the gates of the NMOS transistors N4 and N6. Between the connection nodes c and d that connect the transfer gates N3 and N5 to the NMOS transistors N4 and N6, respectively, and the nodes a and b of the flip-flop on the opposite side, the PN diodes D1 and D2 are connected in directions to make the nodes of the flip-flop directed to the P side (anode side). Bit lines BL and /BL connects to the other terminals of the transfer gates N3 and N5.

Bit line driving by the nodes of the flip-flop is done not by direct driving by the transfer gates but by gate driving of the NMOS transistors N4 and N6 to prevent the above-described data destruction in a cell with a shortage of SNM in the read mode. That is, data destruction by a shortage of SNM occurs when the "L"-level-side node of the flip-flop is raised by the "H" level of a bit line. Hence, when the nodes a and b of the flip-flop do not directly connect to the bit lines through the transfer gates the butterfly curve of the flip-flop changes to a normal CMOS inverter plot, and the SNM largely improves. In other words, this ensures the same margin as a CMOS inverter. The cell actually becomes an SNM-free cell. That is, the SNM greatly increases.

The read and write operations of the SRAM cell according to the first embodiment will be described next.

Figure 3A:
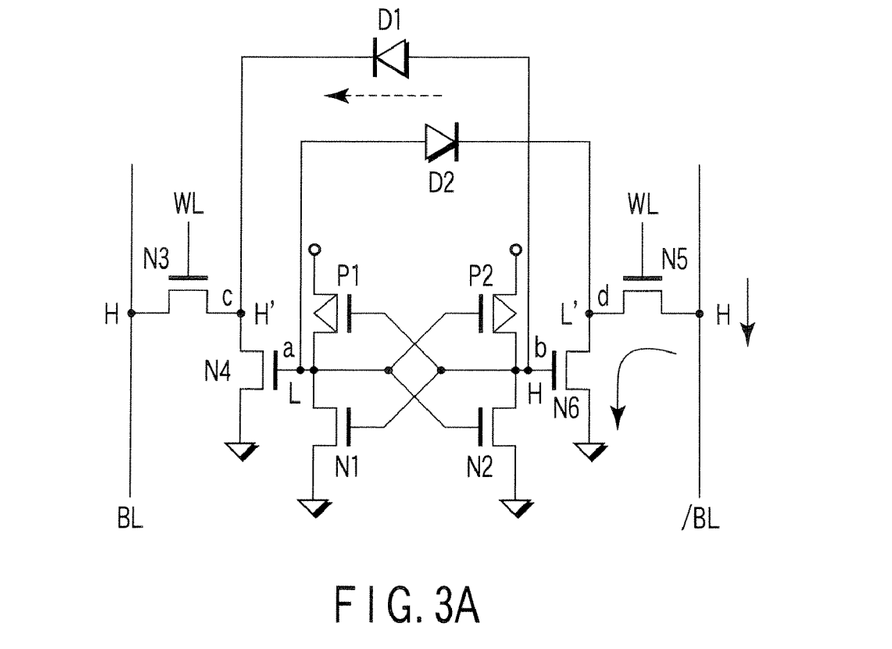
FIG. 3A is a circuit diagram for explaining the read operation of the SRAM cell according to the first embodiment.

In bit line driving in read, as shown in FIG. 3A, the NMOS transistor N6 connected to the "H"-level-side node b of the flip-flop turns on. The two series-connected NMOS transistors, i.e., the NMOS transistor N6 and the transfer gate N5 in the ON state discharge the potential "H" of the bit line (/BL in this case) to generate a potential difference between the bit lines BL and /BL.

The write operation will be considered. In the above-described read architecture, write can be done by providing a transfer gate different from that of the read path to forcibly drive the node of the flip-flop by the bit line potential. In this case, however, the number of elements increases due to addition of the transfer gate dedicated to the write. Word lines to drive the transfer gate need also be provided separately for read and write so as not to turn on in read. This inevitably largely increases the cell area, resulting in an unsuitable structure for SRAM cells that place importance on the degree of integration.

Figure 3B:
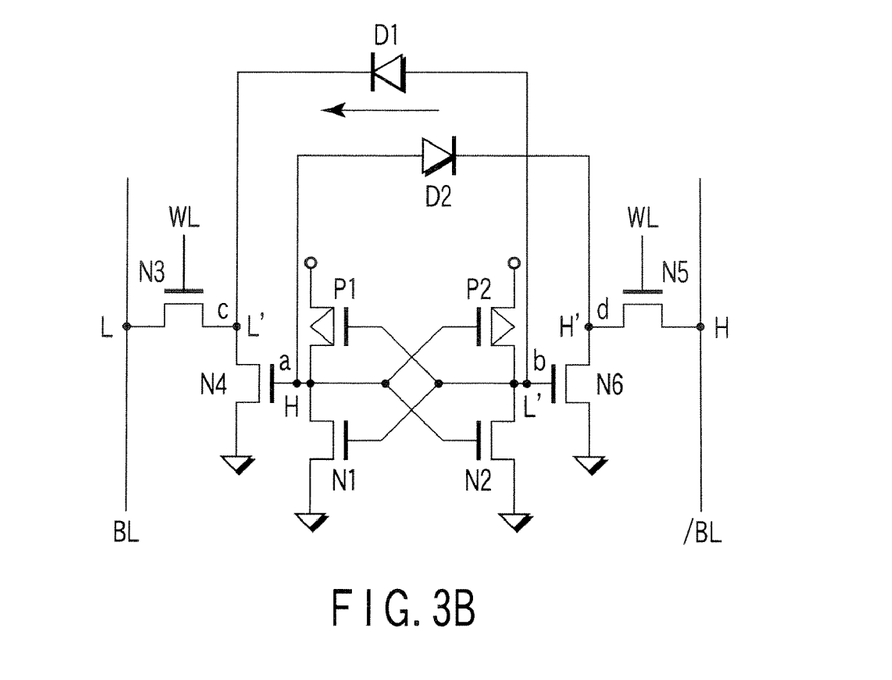
FIG. 3B is a circuit diagram for explaining the write operation of the SRAM cell according to the first embodiment.

In the first embodiment, write is done by using diodes. In write, one of the bit lines lowers to "L" level. When the bit line BL changes to "L" level, as shown in FIG. 3B, this changes the node c to "L" level through the transfer gate N3. The N side (cathode side) of the diode D1 changes to "L" level so that the PN diode D1 turns on to lower the node b to "L" level. At this time, the node b does not completely lower to "L" level because of the potential difference corresponding to the VF of PN junction. However, when the level is set to be lower than the logic threshold value of the inverter formed from the PMOS transistor P1 and NMOS transistor N1, the output from the node a of the inverter shifts to "H" level. The operating point shifts so that the NMOS transistor N2 turns on while the PMOS transistor P2 turns off. This inverts the flip-flop to write data.

Even when the diodes D1 and D2 connect in this way, no data destruction occurs if the bit lines such as unselected columns in the write are at "H" level. More specifically, even when the transfer gates N3 and N5 turn on to change the node c and d to "H" level, only the N side of each PN diode changes to "H". Even if the node a or b on the P side is at "L" level, the PN diodes D1 and D2 do not turn on and influence the node level of the flip-flop. As described above, in both read and write, data destruction due to the shortage of SNM when the word line is ON does not occur.

An increase in the area caused by adding the diodes D1 and D2 to an SRAM cell will be examined here. In the standard CMOS process, a PN diode is formed by a $P^+$-diffusion layer in an N-well or an $N^+$-diffusion layer in a P-well. In this case, however, a very large area is generally necessary because of the design rule around the well. In addition, the presence of a substrate with an opposite conductivity type under the well layer or the presence of the well layer forms a parasitic bipolar, resulting in restriction of the operating voltage.

In recent years, a silicon on insulator (SOI) technology is implemented for the purpose of increasing the performance of an element. In a fully-depleted SOI (FD-SOI), not a well or substrate but an insulating layer exists under a diffusion layer to electrically insulate the diffusion layer. When an $N^+$-region and a $P^+$-region in contact with each other are formed on the same diffusion region by doping impurities, a PN diode insulated from the substrate or well is available. However, it is necessary to avoid forming a salicide layer on the diffusion region, which is generally used recently, on the junction between the $N^+$-region and the $P^+$-region.

Figure 4A:
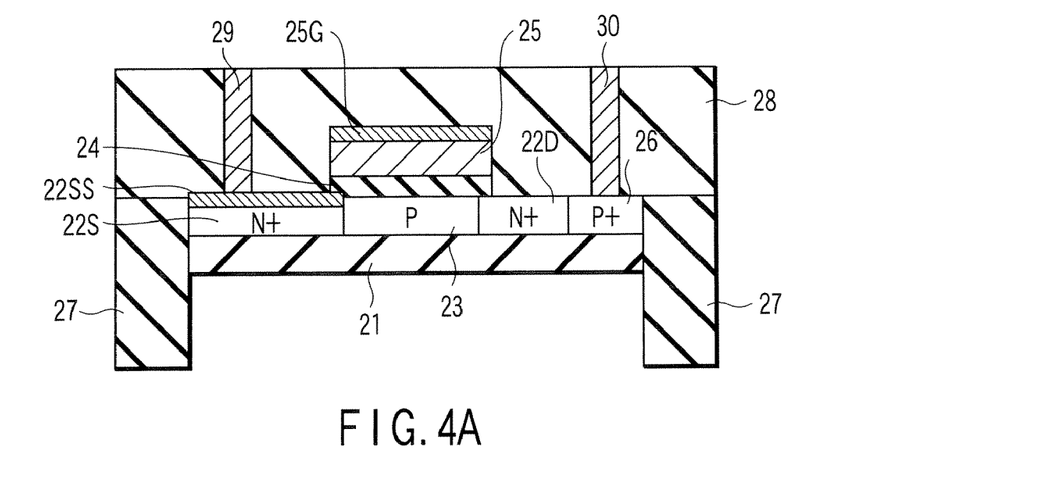
FIG. 4A is a sectional view showing a series circuit of an NMOS transistor and a diode, which is formed by using a fully-depleted SOI.

FIG. 4A shows the sectional structure of a series circuit of the NMOS transistor N4 (or N6) and the diode D1 (or D2), which is formed by using a fully-depleted SOI. An $N^+$-region 22S and a conductive layer 22SS, which serve as a source, and an $N^+$-region 22D serving as a drain are separately formed on an insulating layer 21. The conductive layer 22SS made of, e.g., a salicide layer or metal layer is formed on the $N^+$-region 22S. A gate insulating film 24 is formed on a P-region 23 serving as a channel region between the $N^+$-region 22S and the $N^+$-region 22D. A gate electrode 25 is formed on the gate insulating film 24. A conductive layer 25G made of, e.g., a salicide layer or metal layer is formed on the gate electrode 25. A $P^+$-region 26 contacts the $N^+$-region 22D serving as a drain.

Figure 4B:
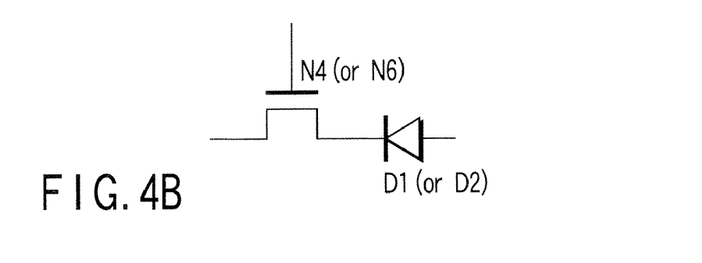
FIG. 4B is a circuit diagram of the section shown in FIG. 4A.

An interlayer dielectric film 28 is formed above the insulating layer 21, including the conductive layer 22SS, $N^+$-region 22D, $P^+$-region 26, and conductive layer 25G. A contact member 29 formed on the conductive layer 22SS contacts the conductive layer 22SS. A contact member 30 formed on the $P^+$-region 26 contacts the $P^+$-region 26. An element isolation insulating film 27 is formed on both sides of the $N^+$-region 22S and $P^+$-region 26 to electrically insulate the element region. When the $P^+$-region 26 is formed in the drain region of the NMOS transistor N4 (or N6) in this way, the series circuit of the NMOS transistors N4 (or N6) and diode D1 (or D2) can be formed by slightly increasing the area to form the $P^+$-region 26. FIG. 4B is a circuit diagram of the sectional structure shown in FIG. 4A.

In the above-described example, a diode is formed in the drain region of an NMOS transistor. Even when only a diode is formed by using a fully-depleted SOI, as shown in FIG. 5, it is possible to form the diode in a small area as compared to the standard CMOS process.

Figure 5:
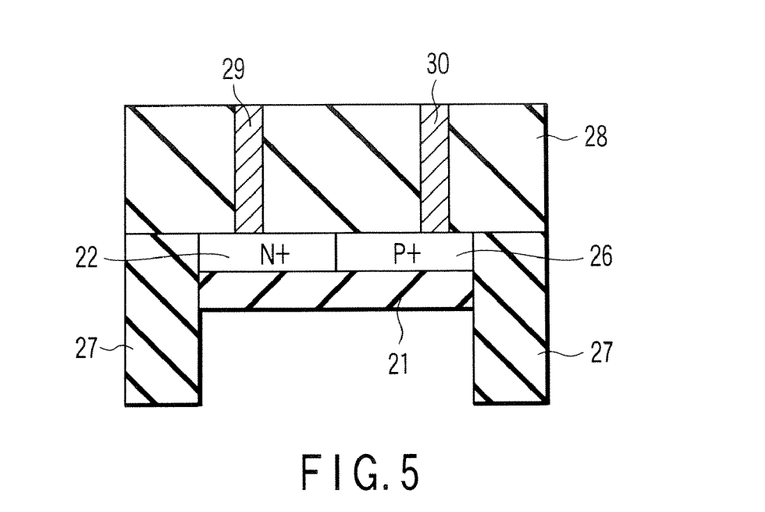
FIG. 5 is a sectional view showing a diode formed by using a fully-depleted SOI.

FIG. 5 is a sectional view showing a diode formed by using a fully-depleted SOI.

An $N^+$-region 22 and $P^+$-region 26 in contact with each other are formed on the insulating layer 21. The interlayer dielectric film 28 is formed above the insulating layer 21, including the $N^+$-region 22 and $P^+$-region 26. The contact member 29 formed on the $N^+$-region 22 contacts the $N^+$-region 22. The contact member 30 formed on the $P^+$-region 26 contacts the $P^+$-region 26. The element isolation insulating film 27 surrounding the $N^+$-region 22 and $P^+$-region 26 electrically insulates the element region. When the $N^+$-region 22 and $P^+$-region 26 are formed on the insulating layer 21 in this way, the diode can be formed in a small area, as described above.

Figure 6:
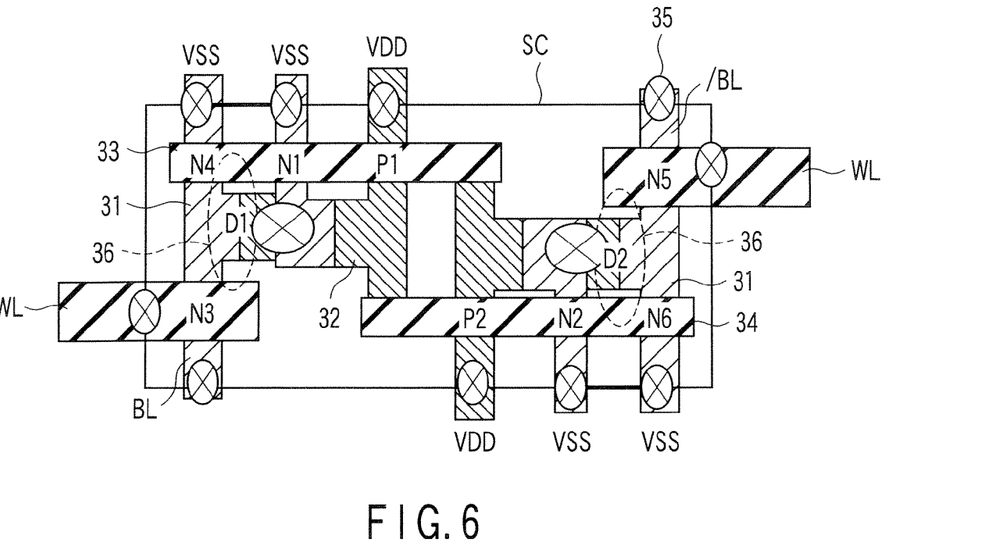
FIG. 6 is a view showing the layout of the SRAM cell according to the first embodiment.

FIG. 6 shows a layout example of the SRAM cell according to the first embodiment. An $N^+$-diffusion layer 31 and a $P^+$-diffusion layer 32 are formed. Gate electrodes 33 and 34 and the word line WL are also formed. A contact 35 connects the $N^+$-diffusion layer 31 or $P^+$-diffusion layer 32 to an upper interconnection (not shown). In a fully-depleted SOI, since no well is formed, the diffusion layers of the PMOS transistor and NMOS transistor directly connect to each other, which are distinguished as a $P^+$-diffusion layer and an $N^+$-diffusion layer. The $P^+$-diffusion layer and $N^+$-diffusion layer electrically connect to each other because a salicide layer is normally formed on them. Hence, by avoiding forming a salicide layer at a junction 36 in FIG. 6 between the $P^+$-diffusion layer and the $N^+$-diffusion layer where the PN diode D1 or D2 should be formed, a diode connection is formed.

Figure 7:
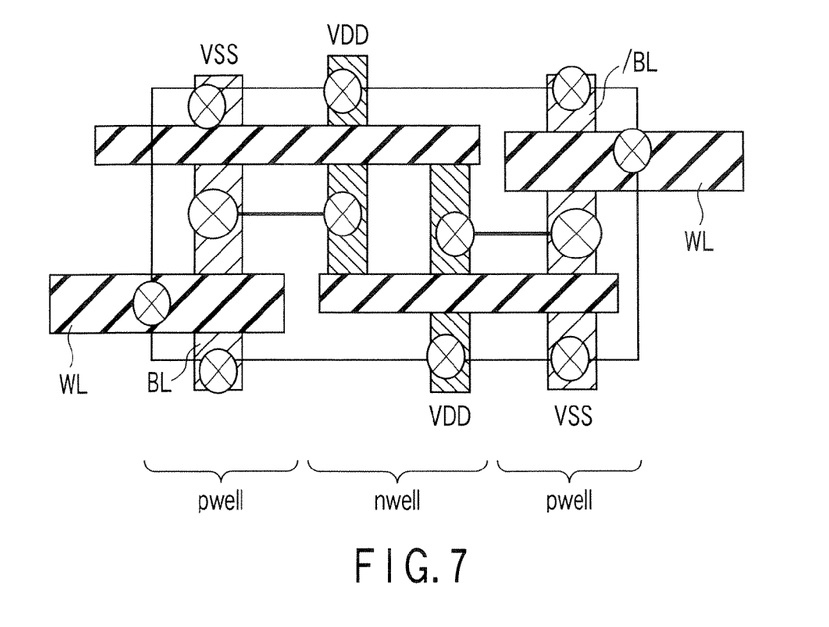
FIG. 7 is a view showing the layout of a conventional SRAM cell including six transistors.

The increase in the area of the layout can basically accurately be estimated to be almost the same as the increase in the area when an NMOS transistor is added to a conventional SRAM cell with six transistors shown in FIG. 7 to form a separate read path, although it depends on the design rule regarding the $P^+$-diffusion layer to form a PN diode or the PN junction where no salicide is formed. Hence, it is possible to greatly suppress the increase in the area to make an SNM-free write path in the layout shown in FIG. 6. The fully-depleted SOI requires no well isolation that restricts area reduction of the conventional SRAM cell shown in FIG. 7 and therefore has a potential to make the cell smaller as compared to the standard CMOS process. This also allows to suppress the increase in the area.

As described above, according to the semiconductor memory device of the first embodiment, a bit line does not directly connect to a storage node of a flip-flop through a transfer gate in an SRAM cell. For this reason, even in a cell with a shortage of SNM due to a variation in a threshold voltage Vth, data destruction does not occur due to disturbance of a word line in the ON state. In both read and write, an SNM-free SRAM cell, i.e., an SRAM cell capable of largely improving the SNM can be implemented. Furthermore, when a PN junction formed in the diffusion layers on the insulating layer by using the fully-depleted SOI technology serves as a diode acting as a write path, an SNM-free cell in write can be implemented while suppressing the increase in the area.

Second Embodiment

A semiconductor memory device according to the second embodiment of the present invention will be described next.

The same reference numerals as in the first embodiment denote the same parts in the second embedment, and a description thereof will be omitted.

A general SRAM cell has a pair of bit lines BL and /BL and executes both the read and write operations by lowering the level of one of the bit lines and obtaining complementary data. In recent years, however, a threshold voltage Vth largely varies, making it difficult to read a small potential difference at a high speed. Hence, there is employed sometimes a technique of greatly reducing the length of a bit line to increase the bit line amplitude to execute read by using only one of the bit lines.

Figure 8:
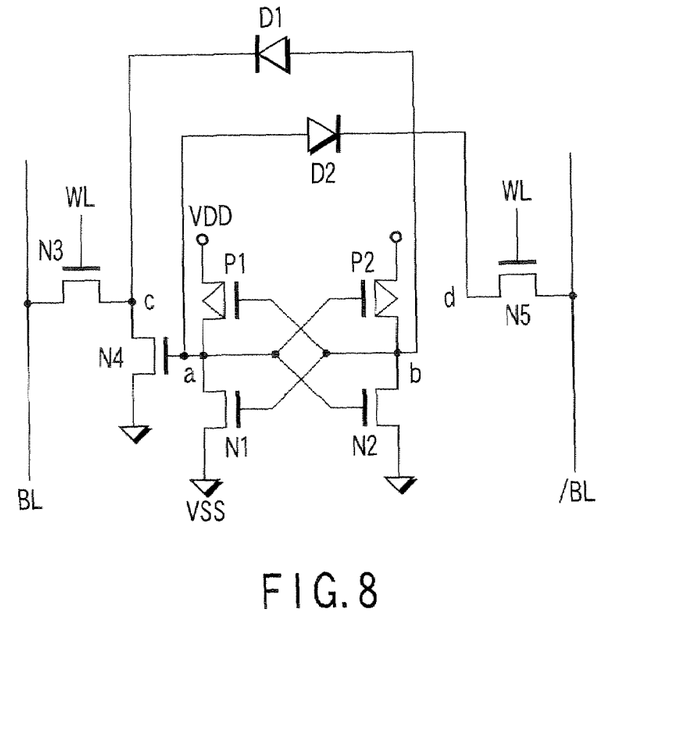
FIG. 8 is a circuit diagram showing the structure of an SRAM cell according to a second embodiment of the present invention.

FIG. 8 is a circuit diagram of an SRAM cell according to the second embodiment of the present invention, which uses the above-described technique. This SRAM cell has a structure obtained by omitting the NMOS transistor N6 that forms a read path in the first embodiment. In the second embodiment with this structure, the read is done by using only the side of the bit line BL. The write is done by using the pair of bit lines BL and /BL. The remaining components and effects are the same as in the first embodiment.

Third Embodiment

A semiconductor memory device according to the third embodiment of the present invention will be described next. The same reference numerals as in the first embodiment denote the same parts in the third embedment, and a description thereof will be omitted.

Recently, to, e.g., reduce the leakage current, the power supply of a flip-flop in an SRAM cell is sometimes controlled to a voltage level different from a normal operating power supply VDD or ground potential Vss.

Figure 9:
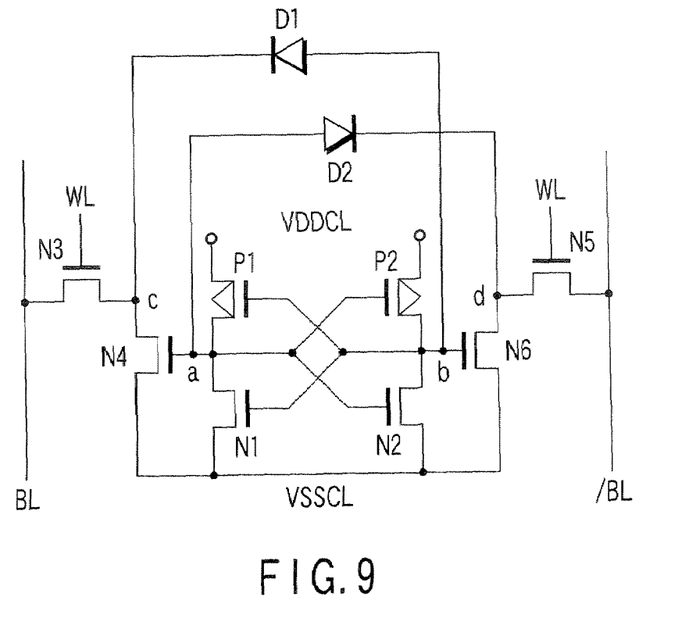
FIG. 9 is a circuit diagram showing the structure of an SRAM cell according to a third embodiment of the present invention.

FIG. 9 is a circuit diagram of an SRAM cell according to the third embodiment of the present invention. In a flip-flop, a voltage VDDCL different from the power supply voltage VDD is supplied to the sources of PMOS transistors P1 and P2, and a voltage VSSCL different from the ground potential Vss is supplied to the sources of NMOS transistors N1 and N2. In this case, the same voltage level as the voltage supplied to the sources of the NMOS transistors N1 and N2 serving as driver transistors, i.e., the voltage VSSCL is supplied to the sources of NMOS transistors N4 and N6.

In the third embodiment with the above-described structure, for example, setting the potential difference between the voltage VDDCL and the voltage VSSCL to be smaller than that between the voltage VDD and the voltage Vss allows to make the leakage current smaller than in the first embodiment. The remaining components and effects are the same as in the first embodiment.

The embodiments of the present invention can provide a semiconductor memory device which includes a memory cell capable of improving the static noise margin (SNM) in the read and write operations. The embodiments of the present invention can provide a semiconductor memory device which includes a memory cell capable of improving the static noise margin while suppressing the increase in the area. The embodiments of the present invention can provide a semiconductor memory device which includes a diode formed in a small area as compared to a diode formed by the standard CMOS process.

Each of the above embodiments can independently be practiced. However, they may appropriately be combined. The above-described embodiments incorporate inventions of various stages, and inventions of various stages can be extracted by appropriately combining a plurality of constituent elements disclosed in the embodiments.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
a flip-flop which is formed by cross-coupling inputs and outputs of two inverters, the flip-flop including a first storage node at one terminal and a second storage node at the other terminal;
a first MOS transistor of first conductivity type which has a gate connected to the first storage node of the flip-flop;
a second MOS transistor of first conductivity type which has a gate connected to the second storage node of the flip-flop;
a first transfer gate which has a current path with one end connected to one end of a current path of the first MOS transistor;
a second transfer gate which has a current path with one end connected to one end of a current path of the second MOS transistor;
a first diode which has an anode connected to the first storage node of the flip-flop and a cathode connected to said one end of the current path of the second transfer gate; and
a second diode which has an anode connected to the second storage node of the flip-flop and a cathode connected to said one end of the current path of the first transfer gate.

2. A device according to claim 1, wherein
each of the inverters included in the flip-flop includes a P-channel MOS transistor and an N-channel MOS transistor,
a drain of the P-channel MOS transistor connects to a drain of the N-channel MOS transistor, a power supply voltage is supplied to a source of the P-channel MOS transistor, and a ground potential is supplied to a source of the N-channel MOS transistor, and
the ground potential is supplied to the other end of the current path of each of the first MOS transistor and the second MOS transistor.

3. A device according to claim 1, wherein
the flip-flop includes a first inverter including a first P-channel MOS transistor and a first N-channel MOS transistor and a second inverter including a second P-channel MOS transistor and a second N-channel MOS transistor,
a drain of the first P-channel MOS transistor, a drain of the first N-channel MOS transistor, a gate of the second P-channel MOS transistor, and a gate of the second N-channel MOS transistor connect to the first storage node, and
a drain of the second P-channel MOS transistor, a drain of the second N-channel MOS transistor, a gate of the first P-channel MOS transistor, and a gate of the first N-channel MOS transistor connect to the second storage node.

4. A device according to claim 3, wherein
a power supply voltage is supplied to sources of the first P-channel MOS transistor and the second P-channel MOS transistor, and a ground potential is supplied to sources of the first N-channel MOS transistor and the second N-channel MOS transistor, and the ground potential is supplied to the other end of the current path of each of the first MOS transistor and the second MOS transistor.

5. A device according to claim 3, wherein a voltage different from a power supply voltage is supplied to sources of the first P-channel MOS transistor and the second P-channel MOS transistor, and a reference voltage different from a ground potential is supplied to sources of the first N-channel MOS transistor and the second N-channel MOS transistor, and the reference voltage is supplied to the other end of the current path of each of the first MOS transistor and the second MOS transistor.

6. A device according to claim 1, wherein a word line connects to gates of the first transfer gate and the second transfer gate, one of a pair of bit lines connects to the other end of the current path of the first transfer gate, and the other of the pair of bit lines connects to the other end of the current path of the second transfer gate.

7. A device according to claim 1, wherein each of the first diode and the second diode is formed from a first semiconductor region of the first conductivity type and a second semiconductor region of the second conductivity type, which are formed in contact with each other on an insulating layer and surrounded by an element isolation insulating region.

8. A device according to claim 1, wherein each of a set of the first MOS transistor and the second diode and a set of the second MOS transistor and the first diode comprises:
   a first semiconductor region of the first conductivity type which is formed on an insulating layer;
   a second semiconductor region of the first conductivity type which is formed on the insulating layer to be apart from the first semiconductor region;
   a third semiconductor region of the second conductivity type which is formed on the insulating layer between the first semiconductor region and the second semiconductor region;
   a gate insulating film which is formed on the third semiconductor region;
   a gate electrode which is formed on the gate insulating film;
   a fourth semiconductor region of the second conductivity type which is formed on the insulating layer to contact the second semiconductor region; and
   an element isolation insulating region which is formed to surround the first semiconductor region, the second semiconductor region, the third semiconductor region, and the fourth semiconductor region.

9. A device according to claim 1, wherein the flip-flop includes a first inverter and a second inverter, the first inverter having an input portion connected to an output portion of the second inverter and an output portion connected to an input portion of the second inverter.

10. A semiconductor memory device comprising:
    a flip-flop which is formed by cross-coupling inputs and outputs of two inverters, the flip-flop including a first storage node at one terminal and a second storage node at the other terminal;
    a MOS transistor of first conductivity type which has a gate connected to the first storage node of the flip-flop;
    a first transfer gate which has a current path with one end connected to one end of a current path of the MOS transistor;
    a first diode which has an anode connected to the first storage node of the flip-flop;
    a second transfer gate which has a current path with one end connected to a cathode of the first diode; and
    a second diode which has an anode connected to the second storage node of the flip-flop, the second diode having a cathode connected to said one end of the current path of the first transfer gate.

11. A device according to claim 10, wherein each of the inverters included in the flip-flop includes a P-channel MOS transistor and an N-channel MOS transistor, a drain of the P-channel MOS transistor connects to a drain of the N-channel MOS transistor, a power supply voltage is supplied to a source of the P-channel MOS transistor, and a ground potential is supplied to a source of the N-channel MOS transistor, and the ground potential is supplied to the other end of the current path of the MOS transistor.

12. A device according to claim 10, wherein the flip-flop includes a first inverter including a first P-channel MOS transistor and a first N-channel MOS transistor and a second inverter including a second P-channel MOS transistor and a second N-channel MOS transistor, a drain of the first P-channel MOS transistor, a drain of the first N-channel MOS transistor, a gate of the second P-channel MOS transistor, and a gate of the second N-channel MOS transistor connect to the first storage node, and a drain of the second P-channel MOS transistor, a drain of the second N-channel MOS transistor, a gate of the first P-channel MOS transistor, and a gate of the first N-channel MOS transistor connect to the second storage node.

13. A device according to claim 12, wherein a power supply voltage is supplied to sources of the first P-channel MOS transistor and the second P-channel MOS transistor, and a ground potential is supplied to sources of the first N-channel MOS transistor and the second N-channel MOS transistor, and the ground potential is supplied to the other end of the current path of each of the first MOS transistor and the second MOS transistor.

14. A device according to claim 12, wherein a voltage different from a power supply voltage is supplied to sources of the first P-channel MOS transistor and the second P-channel MOS transistor, and a reference voltage different from a ground potential is supplied to sources of the first N-channel MOS transistor and the second N-channel MOS transistor, and the reference voltage is supplied to the other end of the current path of each of the first MOS transistor and the second MOS transistor.

15. A device according to claim 10, wherein a word line connects to gates of the first transfer gate and the second transfer gate, one of a pair of bit lines connects to the other end of the current path of the first transfer gate, and the other of the pair of bit lines connects to the other end of the current path of the second transfer gate.

16. A device according to claim 10, wherein each of the first diode and the second diode is formed from a first semiconductor region of the first conductivity type and a second semiconductor region of the second conductivity type, which are formed in contact with each other on an insulating layer and surrounded by an element isolation insulating region.

17. A device according to claim 10, wherein the first MOS transistor and the second diode comprise:
    a first semiconductor region of the first conductivity type which is formed on an insulating layer;

a second semiconductor region of the first conductivity type which is formed on the insulating layer to be apart from the first semiconductor region;

a third semiconductor region of the second conductivity type which is formed on the insulating layer between the first semiconductor region and the second semiconductor region;

a gate insulating film which is formed on the third semiconductor region;

a gate electrode which is formed on the gate insulating film;

a fourth semiconductor region of the second conductivity type which is formed on the insulating layer to contact the second semiconductor region; and an element isolation insulating region which is formed to surround the first semiconductor region, the second semiconductor region, the third semiconductor region, and the fourth semiconductor region.

\* \* \* \* \*